United States Patent
Chen et al.

(10) Patent No.: US 7,963,778 B2
(45) Date of Patent: Jun. 21, 2011

(54) BURN-IN SOCKET WITH PLATED CONTACTS

(75) Inventors: Ming-Yue Chen, Tu-cheng (TW);
Been-Yang Liaw, Tu-cheng (TW);
Wen-Yi Hsieh, Tu-cheng (TW);
Shih-Wei Hsiao, Tu-cheng (TW)

(73) Assignee: Hon Hai Precision Ind. Co., Ltd, New Taipei (TW)

( * ) Notice: Subject to any disclaimer, the term of this patent is extended or adjusted under 35 U.S.C. 154(b) by 247 days.

(21) Appl. No.: 12/317,651

(22) Filed: Dec. 23, 2008

(65) Prior Publication Data
US 2009/0163069 A1    Jun. 25, 2009

(30) Foreign Application Priority Data

Dec. 24, 2007   (TW) ................................ 96221941 U

(51) Int. Cl.
*H01R 12/00* (2006.01)
(52) U.S. Cl. ........................................................ 439/81
(58) Field of Classification Search .................... 439/81,
439/66, 775, 10, 331; 257/677, 766; 205/109,
205/176; 428/670
See application file for complete search history.

(56) References Cited

U.S. PATENT DOCUMENTS

| | | | | |
|---|---|---|---|---|
| 5,984,694 A * | 11/1999 | Sinclair | ............................ | 439/70 |
| 6,150,711 A * | 11/2000 | Kom et al. | .................... | 257/677 |
| 6,274,254 B1 | 8/2001 | Abys et al. | | |
| 7,137,830 B2 * | 11/2006 | Lahiri et al. | .................... | 439/81 |
| 2002/0004329 A1 * | 1/2002 | Ikeya | ............................ | 439/259 |
| 2002/0173174 A1 * | 11/2002 | Nakano et al. | .................. | 439/10 |

* cited by examiner

*Primary Examiner* — Edwin A. Leon
(74) *Attorney, Agent, or Firm* — Andrew C. Cheng; Wei Te Chung; Ming Chieh Chang

(57) ABSTRACT

A burn-in socket for receiving an IC package comprises a socket body, a plurality of contacts mounted in the socket body and an actuator movably mounted upon the socket body. Each contact in the socket body includes a pair of clipping arms with tip portions at free ends thereof respectively. Solder balls attached to the bottom of the IC package are respectively clipped between the pair of the tip portions and thus the IC package should be brought into electrical contact with the contacts of the burn-in socket. The tip portion is plated with a Pd—Co layer for reducing the attachment of the Sn and preventing the impedance of the contacts to increase. Meanwhile, the IC package can be sucked up successfully without absorption from the contacts of the burn-in socket.

6 Claims, 5 Drawing Sheets

BURN-IN SOCKET WITH PLATED CONTACTS

FIELD OF THE INVENTION

The present invention relates to a burn-in socket, and more particularly to a burn-in socket mounted on a printed circuit board (PCB) for receiving and testing an IC package.

DESCRIPTION OF PRIOR ART

Central Processing Unit (CPU) and other electrical package, generally referred to as IC package, are undergone a test simulating its real working environment so as to make sure it functions from all intended ranges.

Typically, a conventional burn-in socket used for testing an IC package has contacts for electrically connecting the leads at the bottom of the IC package, such as solder balls or the likes. Such contacts are usually plated with Au (gold) or other noble metal so as to improve related electrical characteristics of the contacts. However, during the testing process, the gold-plated tip of the contact will be in contact with the solder ball, and accordingly, it is likely to cause the gold-plated tip to be stained with Sn (tin) from the solder balls of the IC package, and increase the impendence of the contacts of the burn-in socket. In addition, after the testing is completed, the IC package is taken out from the burn-in socket by a pick-up means. So if the solder balls of the IC package are stuck to the contacts of the burn-in socket, it will bring difficulty in pick up of the IC package.

Thus, there is a need to provide a new burn-in socket that overcomes the above-mentioned problems.

SUMMARY OF THE INVENTION

It is therefore the object of the present invention to provide a burn-in socket capable of avoiding the phenomenon of tin pick-up, and to provide contacts used in such a burn-in socket.

In order to achieve the object set forth, a burn-in socket made in accordance with the present invention includes a socket body, a plurality of contacts mounted in the socket body and an actuator movably mounted upon the socket body. Each contact includes a pair of clipping arms having a tip portion plated with a Pd—Co layer.

BRIEF DESCRIPTION OF THE DRAWINGS

Other objects, advantages and novel features of the present invention will become more apparent from the following detailed description when taken in conjunction with the accompanying drawings, in which.

DETAILED DESCRIPTION OF PREFERRED EMBODIMENT

Figure 1:
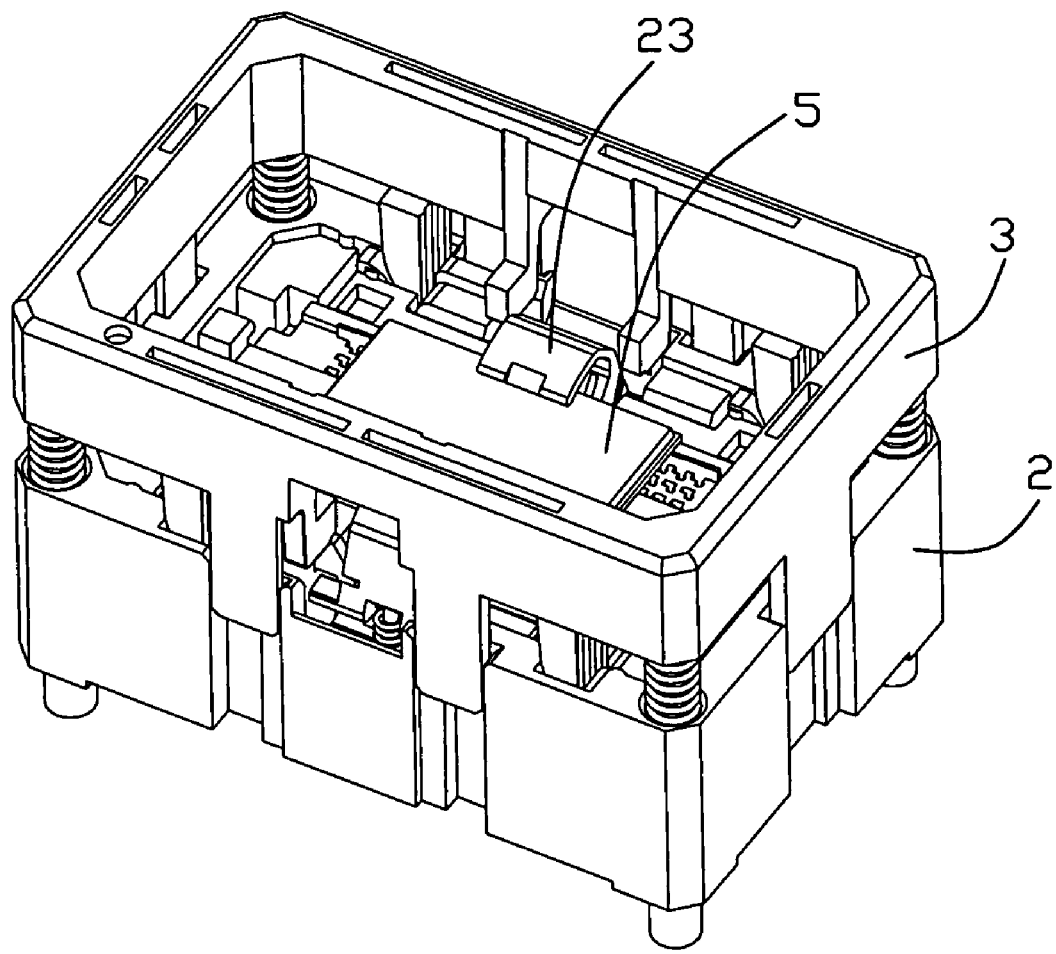
FIG. 1 is an assembled, perspective view of a burn-in socket in accordance with a preferred embodiment of the present invention.
Figure 2:
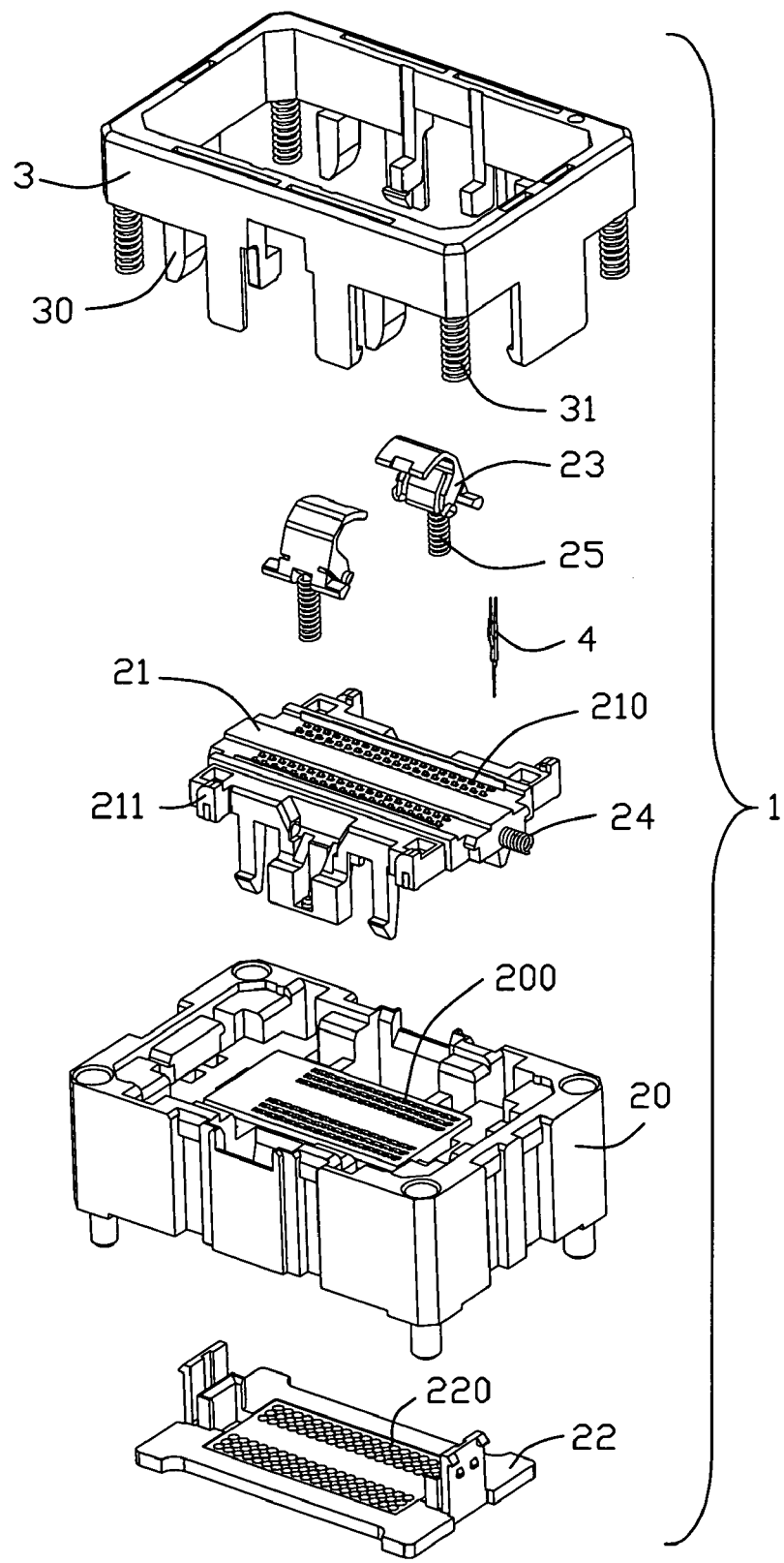
FIG. 2 is an exploded, perspective view of the burn-in socket.

Referring to FIGS. 1-2, a burn-in socket 1 in accordance with a preferred embodiment of the present invention is generally mounted to a printed circuit board (not shown) to receive and test an IC package 5. The burn-in socket 1 includes a socket body 2, a plurality of contacts 4 mounted in the socket body 2, and an actuator 3 movably mounted upon the socket body 2. The IC package 5 should be put into the socket body 2 to be tested.

Figure 3:
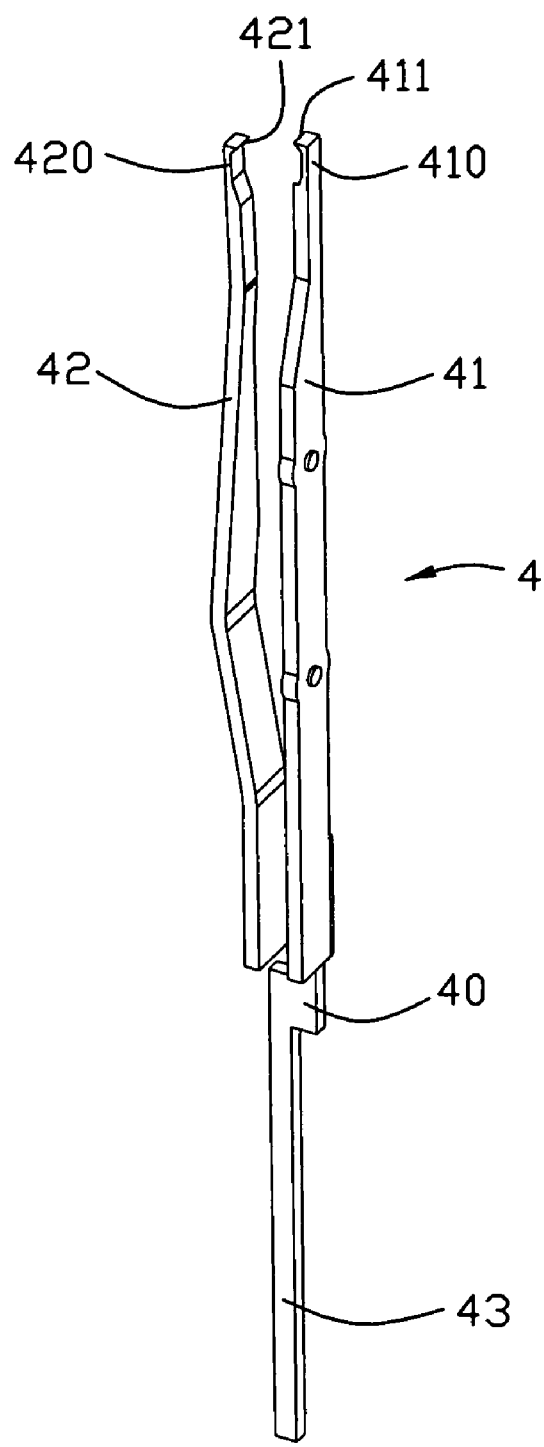
FIG. 3 is a perspective view of a contact of the burn-in socket.
Figure 4:
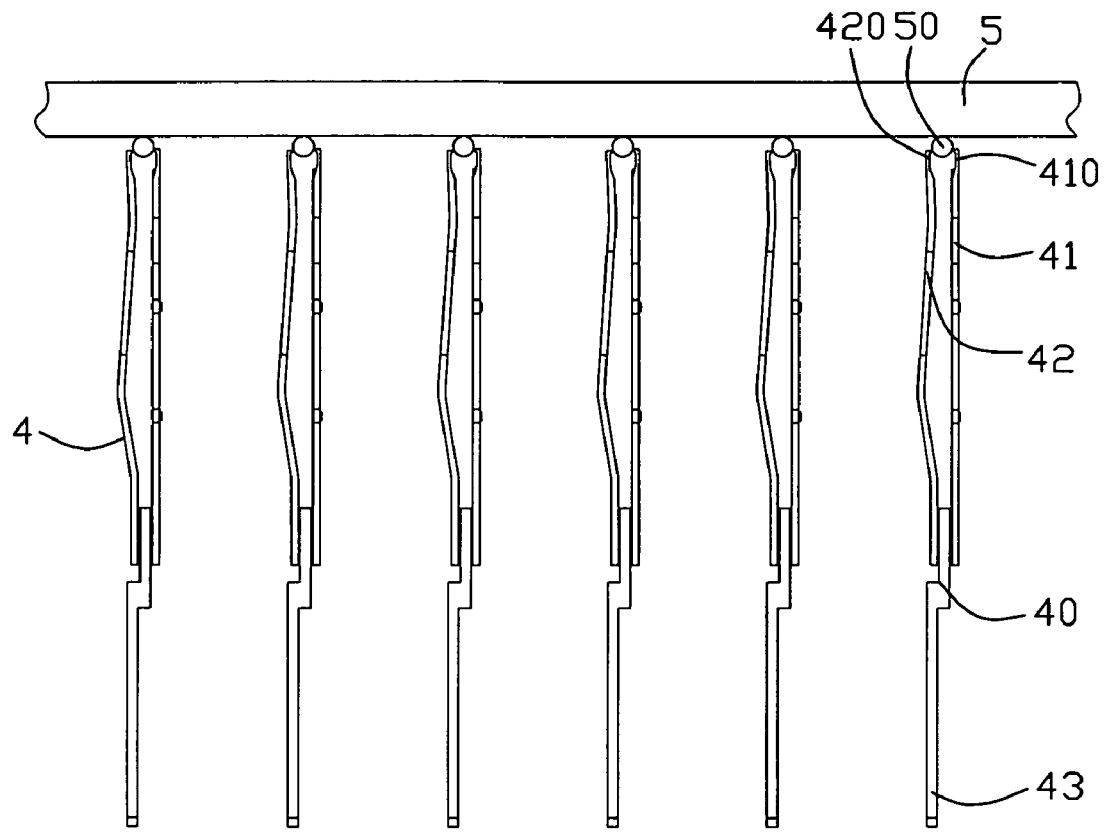
FIG. 4 is a side view of the contacts and an IC package clipped by the contacts.

Referring to FIGS. 3-4, the contact 4 includes a middle base portion 40, a pair of clipping arms 41, 42 respectively extending upwardly from the base portion 40, and a tail portion 43 extending downwardly from the base portion 40. The clipping arm 41 is a stationary one with a linear configuration and the other clipping arm 42 is a movable one having a bended elastic portion (not labeled). The top free ends of the clipping arms 41, 42 are respectively formed with tip portions 410, 420 so as to together clip one solder ball 50 of the IC package 5. The solder ball 50 is mainly made of Sn. The tip portions 410, 420 respectively have one stab 411, 421 toward each other to stab out an oxide layer formed on the outer surface of the solder ball 50.

Particularly referring to FIGS. 2-4, the socket body 2 includes a base 20, a platform 21 capable of moving horizontally along the base 20, a bottom plate 22 fixed to the bottom of the base 20, and a pair of locking elements 23 to together lock the IC package 5 loaded on the platform 21. The bottom plate 22, the base 20, and platform 21 respectively define a plurality of pin holes 220, 200, 210, through which the contacts 4 pass one by one. The base portion 40 is retained in the pin holes 200 of the base 20, and the tip portions 410, 420 extend out of the pin holes 210 of the platform 21, while the tail portion 43 extends downwardly out of the pin hole 220 of the bottom plate 22.

The platform 21 slides in a horizontal direction under actuation from the actuator 3. The platform 21 has a receiving portion 211 with an inclined surface (not labeled), and the actuator 3 correspondingly has a pressing portion 30 capable of moving along the inclined surface so as to actuate the platform 21. The platform 21 is equipped with a spring 24 with one end abutting against the platform 21 and the other end abutting against the base 20, so as to restore the platform 21 after the horizontal movement.

The movable clipping arm 42 moves along with the platform 21 as the platform 21 is actuated to move. The two clipping arms 41, 42 space away from each other and the two locking elements 23 is turned to an open state when the actuator 3 is in a lowest position. In this situation, the IC package 5 is easy to be placed into the socket body 2 or to be taken out from the socket body 2. As the actuator 3 is turned to an original position, the two clipping arms 41, 42 move close to each other and together tightly clip the solder ball 50 of the IC package 5, while the locking elements 23 under the urging of springs 25 are pressing on the IC package 5. It's a known technology concerning to the configuration of the platform 21 and the principles about how to actuate the contacts 4, and will not be specifically described herein. Besides, a spring 31 is provided between the actuator 3 and the socket body 2 so as to reset the actuator 3 after its downward movement.

Pd—Co (palladium-cobalt) alloy is a well known material in the metal material technology field, and now in the present invention, it is used to be plated to the surface to the contacts 4 to form a plated layer. This plated layer has a better performance in wearability and thermal stability, as well as in porosity, than that of the Au or Pd. Moreover, the authors of the present invention eventually found after multiple tests that the Pd—Co layer has a lower affinity, that is, the Pd—Co layer doesn't tends to absorb the Sn, compared to Au. Therefore, the impedance of the contact 4 being plated with Pd—Co layer should be well controlled, and meanwhile the pick-up of the IC package 5 is easy to be completed without significant sticking.

Figure 5:
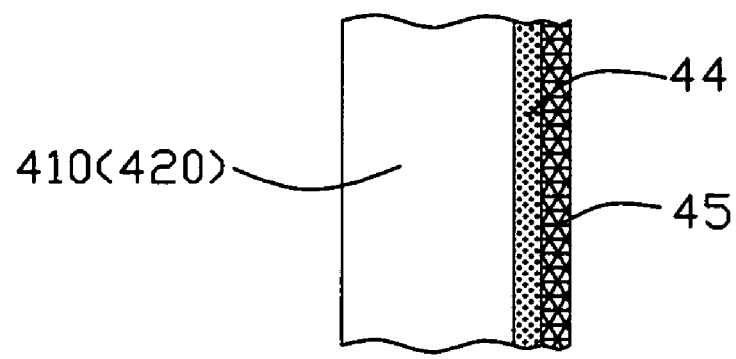
FIG. 5 is an indicating view of plated layers of a tip portion of the contact.
Figure 6:
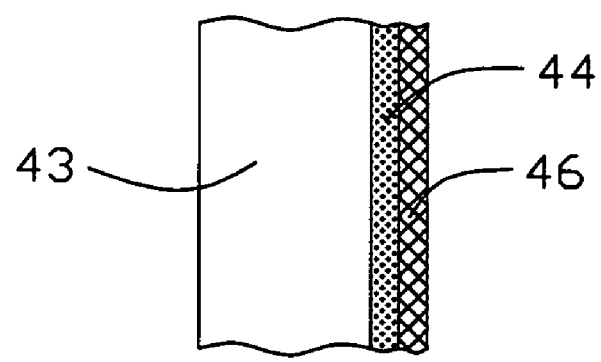
FIG. 6 is an indicating view of plated layers of a tail portion of the contact.

Particularly referring to FIG. 5-6, a Ni (nickel) layer 44 as an inner layer is formed to coat on the whole surface of the contact 4, and a Pd—Co layer 45 as an outer layer is formed to coat on the Ni layer 44 at the tip portions 410, 420. As there is a great affinity between Au and Sn, an Au layer 46 is further formed at the tail portion 43, on the Ni layer 44, so as to get a better welding effect when the tail portion 43 is soldered to the printed circuit board via solder paste of Sn.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A burn-in socket comprising:
    a socket body;
    a plurality of contacts mounted in the socket body, each contact including a pair of clipping arms having a tip portion plated with a Pd—Co layer; and
    an actuator movably mounted upon the socket body;
    wherein the whole surface of the contact is firstly plated with a Ni layer on which said Pd—Co layer is coated;
    wherein each contact comprises a stationary clipping arm and a movable clipping arm;
    wherein said contact has a tail portion where an Au layer is coated on said Ni layer while at least one portion between the tip portion and the tail portion is merely plated with the Ni layer.

2. The burn-in socket as claimed in claim 1, wherein said tip portions respectively have a stab toward each other.

3. The burn-in socket as claimed in claim 2, wherein said socket body comprises a base and a platform capable of moving horizontally along the base.

4. The burn-in socket as claimed in claim 3, wherein said movable clipping arm is able to move along with the platform.

5. A contact used in a burn-in socket comprising:
    a pair of clipping arms, each of which has a tip portion at a top end thereof, the tip portion being plated with a Pd—Co layer;
    wherein the whole surface of the contact is firstly plated with a Ni layer on which said Pd—Co layer is coating;
    wherein said contact has a tail portion where an Au layer is coated on said Ni layer while at least one portion between the tip portion and the tail portion is merely plated with the Ni layer.

6. A contact assembly comprising:
    a metallic contact including a pair of clipping arms with a tip portions thereof two opposite interior surfaces facing to each other; and
    a solder ball of an external part being sandwiched between said two opposite interior surface; wherein
    each of said interior surfaces is located with a Pd—Co layer thereon with an interior Ni layer therebetween; wherein the contact further comprises a tail portion having an Au layer exposed thereon so as to facilitate the soldering with another external part, and a middle portion merely having an exterior Ni layer exposed thereon.

* * * * *